(12) United States Patent
Karwacki

(10) Patent No.: US 6,621,836 B2
(45) Date of Patent: Sep. 16, 2003

(54) TUNABLE MULTI-FREQUENCY VERTICAL CAVITY SURFACE EMITTING LASER

(75) Inventor: Francis A. Karwacki, Lansdale, PA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 4 days.

(21) Appl. No.: 09/820,456

(22) Filed: Mar. 29, 2001

(65) Prior Publication Data

US 2002/0159490 A1 Oct. 31, 2002

(51) Int. Cl.[7] ............................. H01S 3/10; H01S 5/00; H01S 3/08
(52) U.S. Cl. ............................. 372/20; 372/23; 372/96; 372/45
(58) Field of Search ................. 372/45, 96, 26, 372/99, 107, 50, 20, 23

(56) References Cited

U.S. PATENT DOCUMENTS

| 5,216,263 A | * | 6/1993 | Paoli | 372/50 |
| 5,408,486 A | * | 4/1995 | Shoji | 372/45 |

* cited by examiner

*Primary Examiner*—Quyen Leung
(74) *Attorney, Agent, or Firm*—Ron Billi

(57) ABSTRACT

A tunable Vertical Cavity Surface Emitting Laser (VCSEL) is disclosed that produces N frequencies of visible light. The VCSEL comprises an array of quantum wells (QWMs) which replaces one of the normally present Distributive Bragg Reflectors (DBR) at one end of a laser cavity of the VCSEL. These N independent QWMs produce N independent frequency in the laser cavity of the VCSEL device.

12 Claims, 4 Drawing Sheets

TUNABLE MULTI-FREQUENCY VERTICAL CAVITY SURFACE EMITTING LASER

BACKGROUND OF THE INVENTION

1. Field of the Invention

The present invention relates to semiconductor lasers that emit light at visible wavelengths, and more particularly, to Vertical-Cavity Surface-Emitting Lasers (VCSELs) that produce N-frequencies of visible light in a single cavity by altering the optical length of the cavity through the use of a Quantum Well Mirror (QWM) replacing one of the Distributed Bragg Reflectors (DBRs) typically found in a VCSEL.

2. Description of the Prior Art

Semiconductor lasers, such as VCSELs, emit at a visible wavelength in the range of about 400 nm to 700 nm and are of particular interest for applications, such as optical scanning, image display, laser printing and xerography, optical data storage and readout, and plastic-fiber-base optical communications. The VCSELs are known in the art, some of which are described in U.S. Pat. Nos. 5,557,627 and 5,719,892, both of which are herein incorporated by reference. The prior art VCSEL devices commonly are comprised of a gain medium and at least two (DBRs) comprising alternate layers of semiconductive material such as GaAlAs/AlAs. It is desired to have a tunable VCSEL that produces N-light frequencies by adjusting the optical cavity length by applying an electric field to quantum wells devices, in the QWM, changing the refractive index of the well material. It is also desirable to have N of these structures fabricated into an array. In this manner N identical or different frequencies can be produced.

The frequency spectrum of the VCSEL devices is dependent, in part, on the optical cavity length of the laser cavity which, in turn, is dependent on the index of refraction of the alternating layers of the DBRs. One process known in the prior art is to have one VCSEL device produce multiple visible light frequencies in the spectrum by using the oxygenation of a layer or layers in the DBR to change the index of refraction. For example, if a multilayered DBR structure in which one of the alternating layers is composed in part of Al is fabricated and oxygenated after fabrication by introducing oxygen into the deposition chamber, a change in the refractive index of the layer containing Al will occur. The oxygen will migrate into the Al layer from the edge of the structure creating an index of refraction that changes its magnitude in a parabolic manner. This parabolic shape of the index of refraction will produce different visible light frequencies along the length of the AlAs layer. A second method for providing for multiple light frequencies developed by VCSEL devices is the heating of certain areas of the substrate of the DBR during the deposition thereof which will, in turn, creates different indices of refraction in the area being heated and hence creates different light frequencies to be developed by the VCSEL. These procedures are relatively complicated and it is desired to provide for a VCSEL, which can tune to N different light frequencies in a relatively simple manner.

OBJECTS OF THE INVENTION

It is a primary object of the present invention to provide for a VCSEL device that is tunable to N different light frequencies.

It is another object of the present invention to provide for a VCSEL device, wherein the fundamental frequency of its associated cavity can be established by the selection of a particular material composition.

It is a further object of the present invention to provide for a VCSEL array whose multiple light frequencies may be easily tuned and modulated.

It is a further object of the present invention to provide for a VCSEL device that may be fabricated of different semiconductor materials that provide a desired bandgap for fundamental light frequencies of interest.

In one embodiment, a tunable multi-frequency VCSEL is provided comprising a first DBR disposed on the surface of a substrate; a first electrode disposed on the DBR; a tuning region composed of quantum wells disposed on the first electrode; and a second electrode disposed on the tuning region. The VCSEL further preferably comprises an active region disposed on the second electrode and a second DBR disposed on the active region.

In another embodiment, an array of tunable multi-frequency VCSELs is fabricated on a substrate each of which has its own external connection to an external power supply. The array can provide N independent identical or different frequencies.

BRIEF DESCRIPTION OF THE DRAWINGS

Features and advantages of the invention, as well as the invention itself, will become better understood by reference to the following description when considered in conjunction with the accompanying drawings, wherein like reference numbers designate identical or corresponding parts thereof and wherein.

DETAILED DESCRIPTION OF THE PREFERRED EMBODIMENTS

Figure 1:
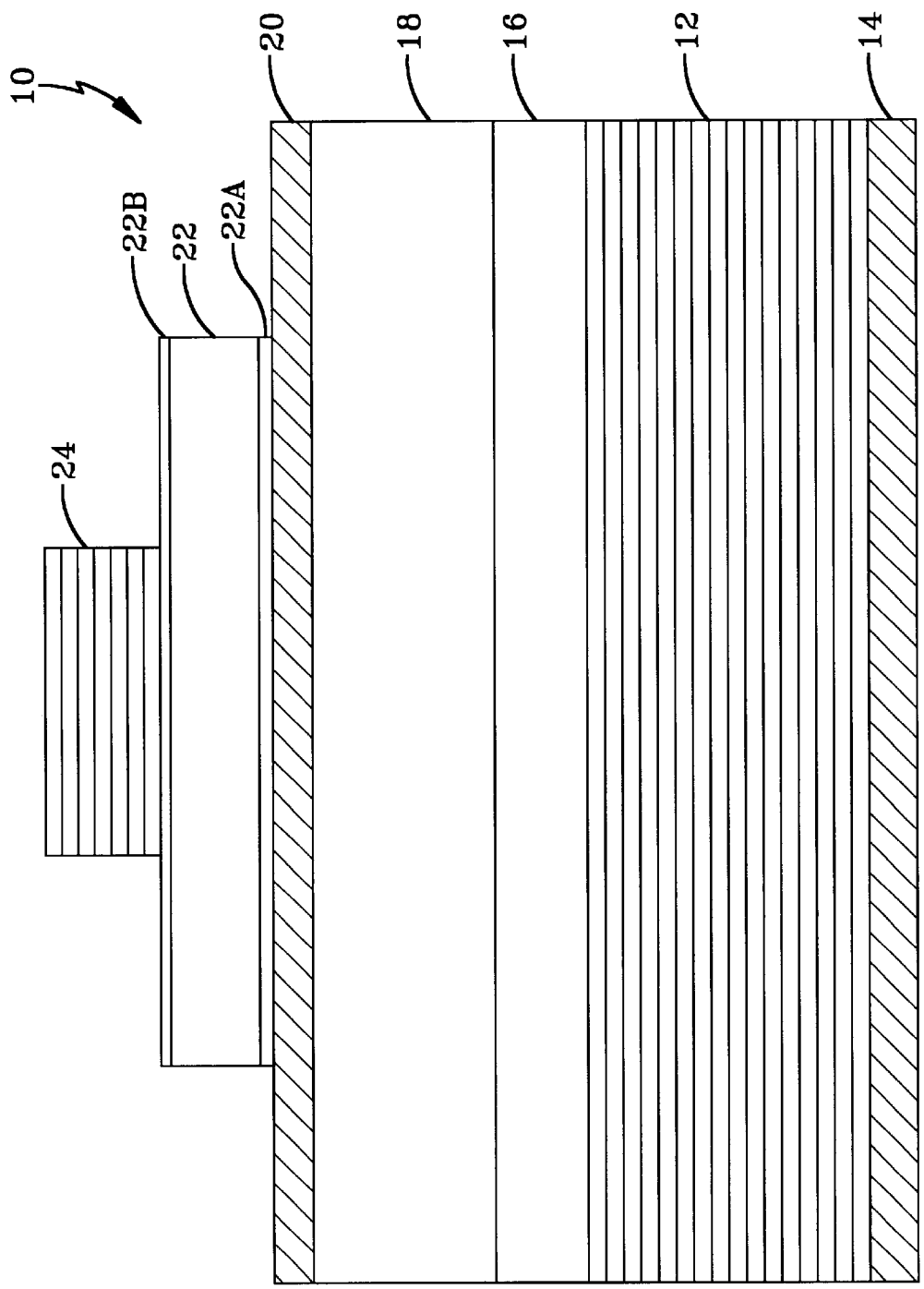
FIG. 1 is a schematic diagram of a VCSEL in accordance with one embodiment of the present invention.

With reference to the drawing, FIG. 1 illustrates a schematic diagram of a tunable multi-frequency VCSEL device 10 of the present invention. The VCSEL device 10 is tunable to N visible frequencies and comprises a QWM that replaces at least one of the DBRs commonly found in the prior art VCSEL devices. As will be further described hereinafter, the QWM element in the VCSEL is tunable so as to develop one of the visible light frequencies, by applying a specific voltage to its electrode, making up the multiple visible light spectrum developed by the this device 10.

The VCSEL device 10 comprises a first DBR 12 disposed on a surface of the substrate (not shown in FIG. 1 because of the cross-sectional view thereof, but known in the art) and a first electrode 14 deposited on the DBR 12. It is preferred that the VCSEL device 10 comprise an absentee layer 16 upon which is disposed on tuning region 18 provided by a QWM. A second electrode 20 is disposed on the quantum well mirror 18. An active region 22 is disposed on the second electrode 20 and has first and second transitional layers 22A and 22B respectively. Disposed on the active region 22 is a second DBR 24. The VCSEL device 10 may be further described with reference to FIG. 2.

In general, the QWM device 18 has a multi-layer thin film semiconductor structure that has an effective plane of reflection. The effective plane of reflection exists within the structure and is defined to be the distance d, shown in FIG. 2 from the front surface of the structure. The position of distance d, relative to the front surface, is a function of the light absorption in the well layer 34 (to be described) of the QWM 18. Because the position is a function of the absorption of the light, it is also a function of the index of refraction of the material making up the layers. Any change in the index of refraction of the material causes a shift in the position of the effective plane of reflectance. Therefore, in accordance with the practice of the present invention, by using the QWM structure with an applied and selectable electric field, the Quantum Confined Start Effect, known in the art, will shift the index of refraction of the well material changing the position of the effective plane of reflectance.

Figure 2:
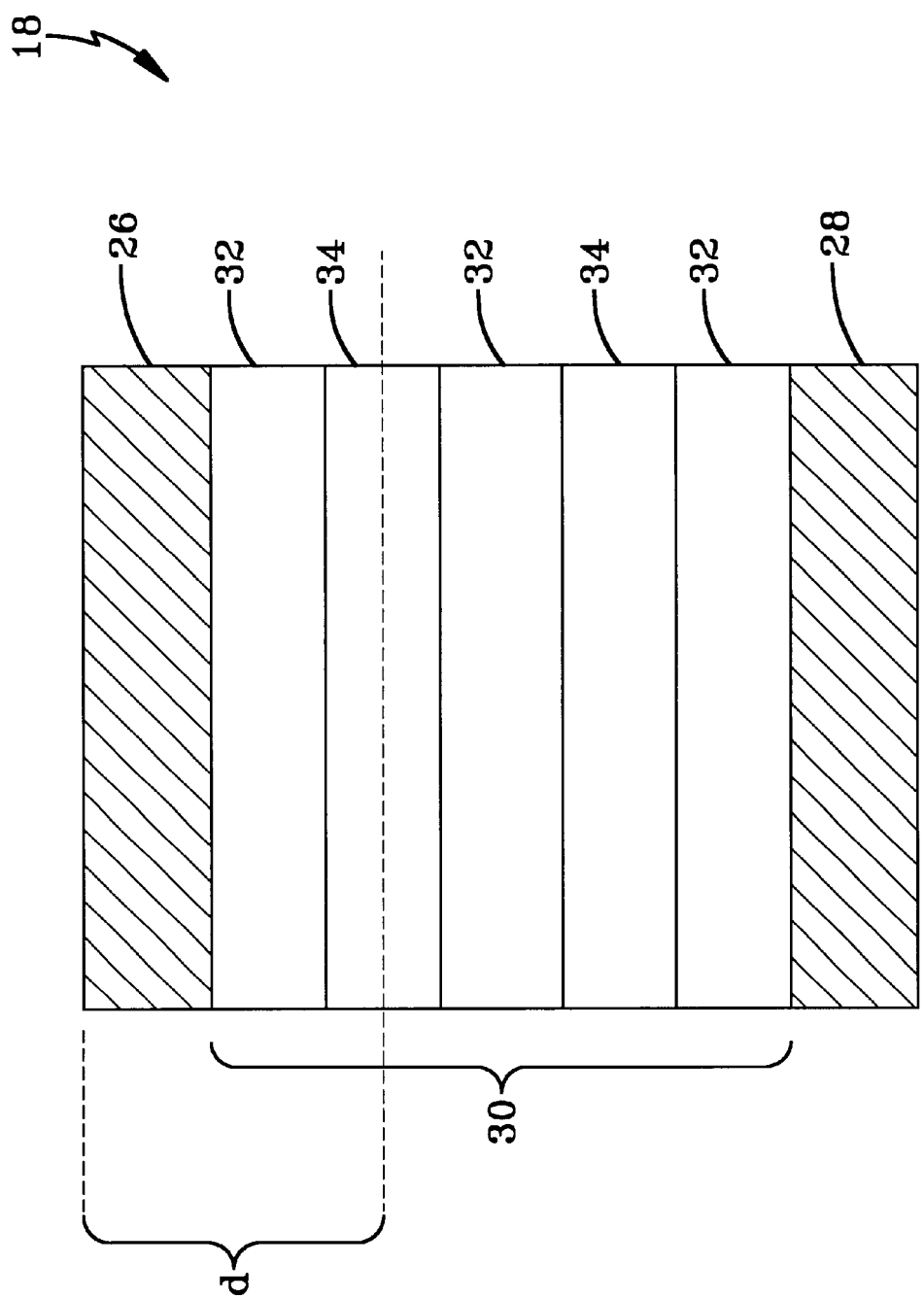
FIG. 2 is a schematic of a QWM used in the embodiments of the present invention.

The QWM device 18 of FIG. 2 comprises top and bottom electrodes 26 and 28 respectively with the bottom electrode 28 having a surface upon which the alternating layers of the QWM device 18 rest. The QWM device 18 comprises n-layered pairs 30 of semiconductor material disposed on the surface of the bottom electrode 28. The n-layered pairs 30 comprises barrier and well layers pairs 32 and 34, respectively, which form at least one sequence of barrier (32) well (34), barrier (32), and well (34) layers. The n-layered pairs 30 terminate with the last of the sequence being a barrier layer 32 as shown in FIG. 2.

The material comprising the well layer 34 serves as a confinement region for the electrons and as is the basis for changing the index of refraction of the present invention. This material is selected based on the central operation wavelength λ of the VCSEL device 10. The wavelength defines the bandgap energy $E_g$ through the relationship $E_g=h\nu$, where h represents the Planks constant. The difference in energy between the conduction and valance bands of the well material making up the well layer 34 is $E_g$. The material making up the barrier layer 32 is selected based on the well to barrier valance and conduction band offsets. The typical band energy offsets are 40% for the valance and 60% for the conduction band. The energy difference in the conduction band forms, in a manner known in the art, a well deep enough to trap electrons. The trapping in conjunction with the width of the well, typically <100 Angstroms, restricts the movement of the electrons in the direction of the width of the well. If an electric field is applied to the quantum well (QW), the Quantum Confined Stark Effect (QCSE), known in the art, occurs. More particularly, if an electric field is applied across the electrodes 26 and 28 of the QWM device 18 then the QWM device 18 shifts its effective plane of reflection changing the frequency in the cavity.

As will be further described with reference to FIG. 3, the applied electric field shifts the bandgap energy levels which, in turn, changes the index of refraction which, in turn, changes the operating wavelength λ of the VCSEL device 10. For the structure of QWM device 18 of FIG. 2, an apparent plane of reflection can be calculated based on the change of phase (∂φ) of the light with respect to the change in propagation constant (∂Δβ) described as $$\left(\frac{\partial \varphi}{\partial \Delta \beta}\right)$$

which is evaluated at Δβ=0. This defines the effective cavity length ($L_{eff}^{qw}$) change for the QWM. This added to the effective path in the DBR ($L_{eff}^{dbr}$) provides the total path in the QWM, that is, $L_{eff}^{qwm}=L^{dbr}+L^{qw}$ The total effective cavity length ($L_{eff}$) is then given by adding the length of the active gain media $L^{ag}$ to this equation and then multiplying $L_{eff}^{dbr}$ by 2 yielding the quantity $L_{eff}=2(L^{ag}+L_{eff}^{qwm})$ With reference to FIG. 1, it is seen that a single QWM device 18 is used to replace one of the DBR of a typical VCSEL device, such as those disclosed in U.S. Pat. Nos. 5,557,627 and 5,719,892. The fundamental frequency within the cavity can be set by applying a DC voltage, having a possible value between 0 to 10 volts, across the electrodes 26 and 28 of the QWM device 18. This will set a particular cavity length for the VCSEL device 10. If modulation is required, an additional time varying signal can be applied across the electrodes 26 and 28, in a manner to be described hereinafter with reference to FIG. 3.

Figure 3:
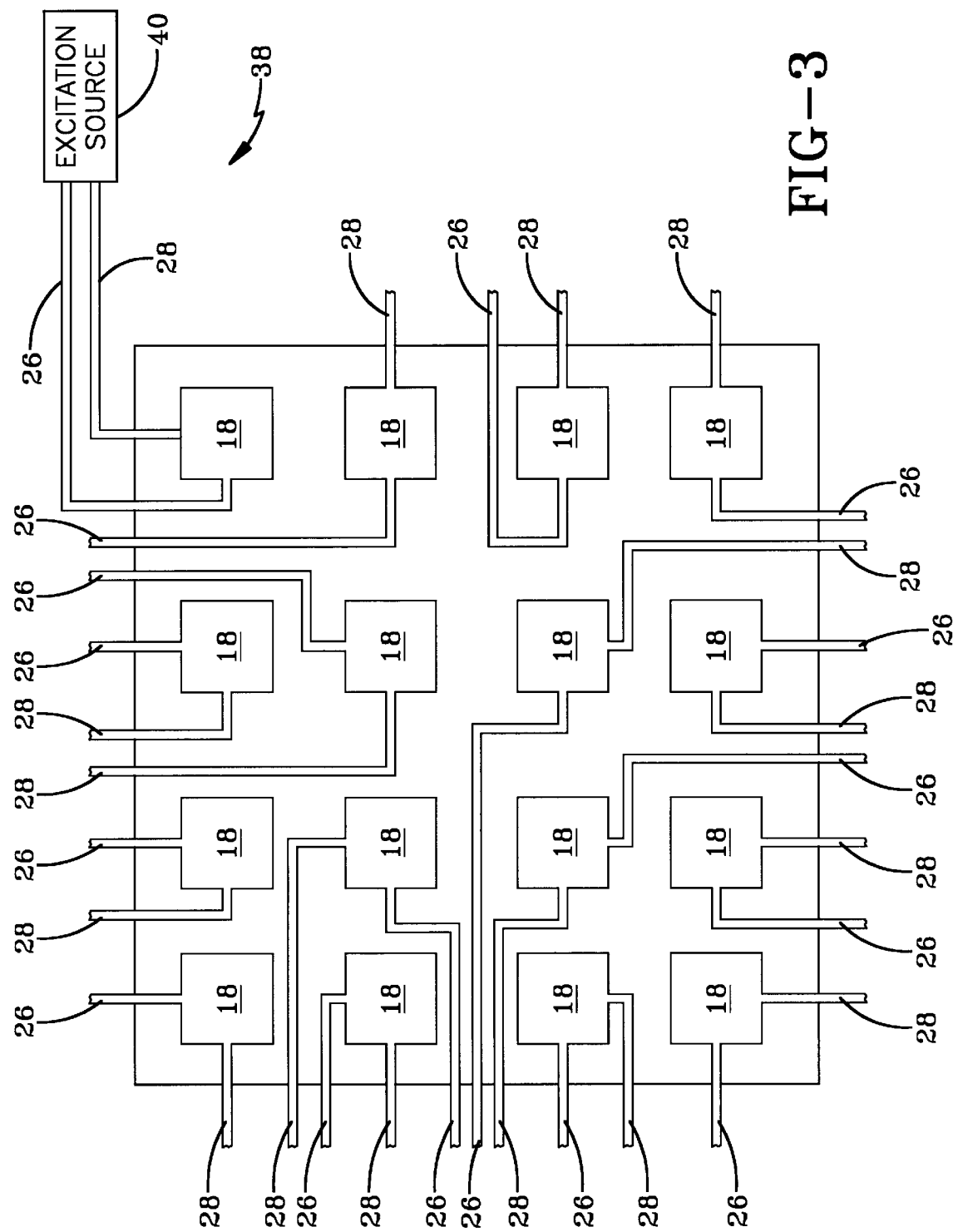
FIG. 3 is a perspective view of an array of sixteen (16) QWM comprising an array of VCSELs that produces multiple visible light frequencies.

To produce a laser cavity, such as tuning region 18 shown in FIG. 1, which can shift between frequencies in a single cavity, in order to produce N simultaneous frequencies such as FIG. 3, an array of VCSEL's with QWM devices 18 needs to be fabricated, that is, to replace one of the typical DBR found in typical VCSEL devices with a QWM 18 device. One such array 38 of QWM devices 18 is shown in FIG. 3.

Figure 4:
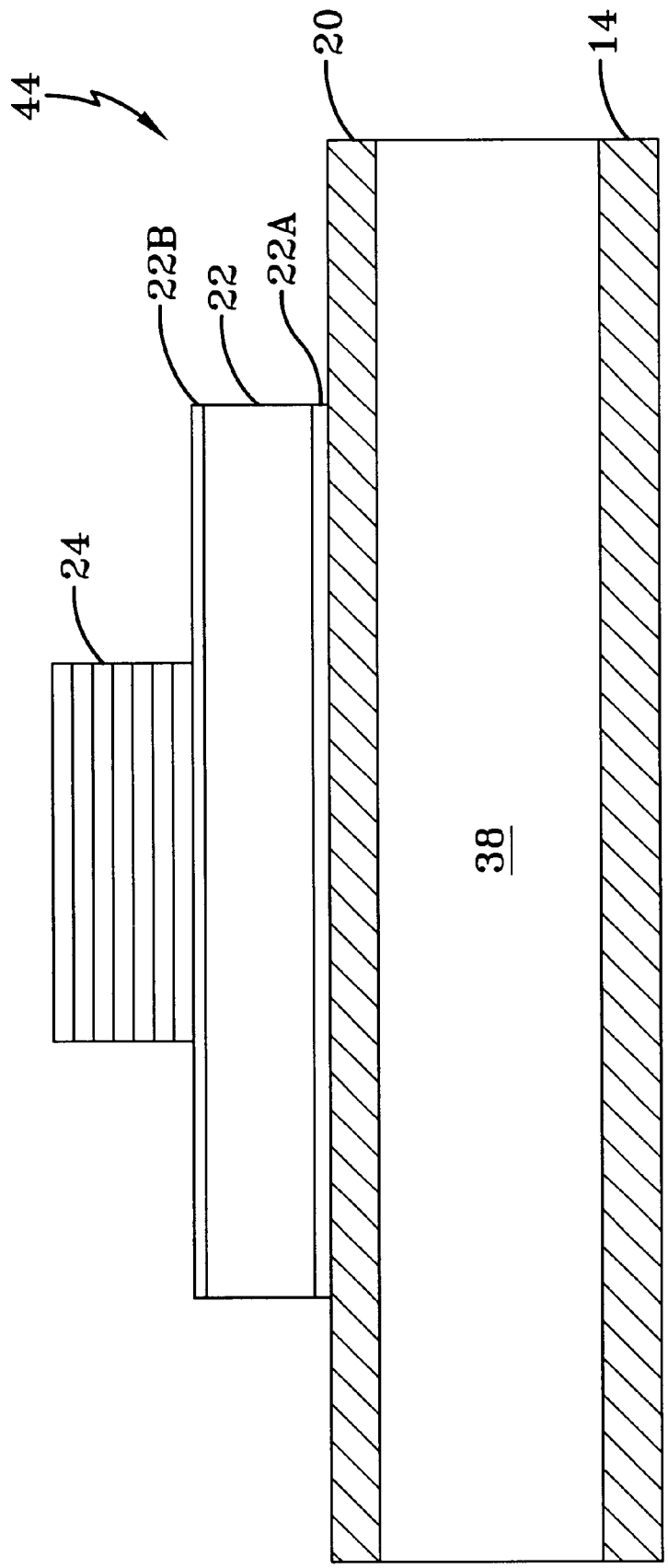
FIG. 4 is a schematic diagram of another embodiment of the present invention.

The array 38 is composed of sixteen individual QWMs 18. Each QWM 18 device can be set to a different fundamental frequency by applying a different DC voltage to each of the elements, that is, across its respective electrodes 26 and 28. Modulation of the fundamental frequencies can be achieved through an additional AC signal applied to the electrodes 26 and 28 of each of the QWM devices 18. The DC voltage and the AC signals may be generated by an excitation source 40 in a manner known in the art. The VCSEL device 44 containing the array 38 is shown in FIG. 4 and having some of the elements previously described with reference to FIG. 1.

If different fundamental frequencies are desired, different fundamental (or central) wavelengths, one VCSEL at 850 nm and another VCSEL at 852 nm, may be used. The material composition of the material making up well layer 34 in the QWM device 18 can be altered. That is, for example, for $Al_{x-1}Ga_xAs$ well material the concentration (X) at deposition for the material making up the well layer 34 can be fixed to a different value, for example, X=0.30 instead of the typical X=0.25. This will provide well layers 34 with different indices of refraction for each X value, and hence different cavity lengths.

The absentee layer 16, shown in FIG. 1, is an optically inactive layer, of a prescribed thickness, and it can be added to the QWM 18 for phase adjustment. This optically inactive layer 16 can be placed between the top electrode 26 of the QWM 18 and the first barrier layer 32 that is in contact with electrode 26.

It should now be appreciated that the practice of the present invention provides for a tunable multi-frequency VCSEL having a number of visible light frequencies. Each QWM device 18 within the VCSEL array 38 can produce a single frequency, which can be tuned through the use of electrodes 26 and 28 of the QWM device 18 and the excitation source 40 applied across the electrodes 26 and 28. In addition, the individual fundamental frequency of the QWM device 18 can be set by the concentration of specific material in the well structure of the QWM device 18, such as the material used for the well layers 34. If a RF signal is applied, a modulation can be induced on the laser fundamental frequency of the selected QWM device 18. Accordingly, the VCSEL device 10 can be easily tuned and modulated through easily controlled methods.

It should now be appreciated that the practice of the present invention provides for various embodiments of VCSEL devices, all of which are tunable to N frequency.

In the practice of the present invention a preliminary calculation was performed to determine the number of modes that can be supported in the cavity. In one embodiment, and assuming a typical gain, it is possible to switch between 8 to 16 modes. The result of the calculations were based on known values of existing multi-mode lasers, with the size of each QWM element being a 5 by 5 micron square. The size was selected for single mode operation of the QWM elements 18. The dimension of the VCSEL devices 10 or 42 should include one-half of a two micron strip that would run between the QWM elements 18, thereby, increasing the entire size of the surface of each QWM 18 element to be about a 6 by 6 micron square.

It is understood that the invention is not limited to the specific embodiments herein illustrated and described and may be otherwise without departing from the spirit and the scope of the invention.

What I claim is:

1. A VCSEL having a quantum well mirror (QWM) comprising:
   (a) a First Distributed Bragg Reflector (DBR) disposed on a substrate;
   (b) a first electrode disposed on said DBR;
   (c) a tuning region separate and distinct from said first Distributed Bragg Reflector (DBR) and composed of quantum wells disposed on said first electrode;
   (d) a second electrode disposed on said tuning region;
   (e) an active region disposed on said second electrode; and
   (f) a Second Distributed Reflector (DBR) disposed on said active region.

2. The VCSEL according to claim 1, wherein each of said QWM comprises;
   (a) top and bottom electrodes with the bottom electrode having a surface;
   (b) n-layered pairs of semiconductor material disposed on said surface of said bottom electrode, said n-layered pairs comprised of barrier and well layered pairs forming at least one sequence of barrier, well, barrier, well layers with the last of said at least one sequence being a barrier layer.

3. The VCSEL according to claim 2, wherein said central operational wavelength λ is defined by the bandgap energy $E_g$ according to the expression (1):

$$E_g = h\nu \tag{1}$$

where h is the Planks constant.

4. The VCSEL according to claim 2, wherein the type of voltage connected to said top and bottom electrodes determines other operational frequencies of the respective QWM which, in turn, provides one of frequencies of light developed by said VCSEL.

5. The VCSEL according to claim 1, wherein said semiconductor material is selected in accordance with the operational wavelength λ of said vertical cavity surface emitting laser.

6. The VCSEL according to claim 1, further comprising an absentee layer interposed between said tuning region and said DBR.

7. The VCSEL according to claim 6, wherein said absentee layer is comprised of an optically inactive material.

8. A VCSEL comprising:
   (a) a first electrode having a surface;
   (b) an array of quantum well mirrors (QWMs) with a tuning region disposed on said surface of said first electrode, each of said quantum well mirrors having separate electrodes;
   (c) a second electrode disposed on said first tuning region;
   (d) an active region disposed on said second electrode; and
   (e) a DBR separate and distinct from said array of quantum well mirrors (QWMs) and disposed on said active region.

9. The VCSEL according to claim 8, wherein each of said QWMs comprises:
   (a) top and bottom electrodes with the bottom electrode having a surface;
   (b) n-layered pairs of semiconductor material disposed on said surface of said bottom electrode, said n-layered pairs comprised of barrier and well layered pairs forming at least one sequence of barrier, well, barrier, well layers with the last of said at least one sequence being a barrier layer.

10. The VCSEL according to claim 9, wherein said operational wavelength λ defines the bandgap energy $E_g$ by the Expression (1):

$$E_g = h\nu \tag{1}$$

where h is Planks constant.

11. The VCSEL according to claim 9, wherein the type of voltage connected to said top and bottom electrodes determines the optical cavity length contribution to the respective QWM which, in turn, provides one of frequencies of light developed by said vertical cavity surface emitting laser.

12. The VCSEL according to claim 8, wherein said semiconductor material is selected in accordance with the central operational wavelength λ of said vertical cavity surface emitting laser.

\* \* \* \* \*